United States Patent [19]

Davis

[11] Patent Number: 4,545,054

[45] Date of Patent: Oct. 1, 1985

[54] DIODE-CONFIGURED VITERBI ALGORITHM ERROR CORRECTING DECODER FOR CONVOLUTIONAL CODES

[75] Inventor: Robert C. Davis, Indialantic, Fla.

[73] Assignee: Harris Corporation, Melbourne, Fla.

[21] Appl. No.: 530,717

[22] Filed: Sep. 9, 1983

[51] Int. Cl.[4] .................................................. G06F 11/10
[52] U.S. Cl. ........................................................... 371/43
[58] Field of Search ..................................... 371/43, 44, 45

[56] References Cited

U.S. PATENT DOCUMENTS

| | | | |
|---|---|---|---|
| 3,538,497 | 11/1970 | Harmon ................................. | 371/43 |
| 3,789,360 | 1/1974 | Clark, Jr. et al. ..................... | 371/43 |
| 4,087,787 | 5/1978 | Acampora ............................. | 371/43 |

OTHER PUBLICATIONS

Clark, Jr. et al., Error-Correction Coding for Digital Communications, Plenum Press, New York, 1981, pp. 227-235.

Primary Examiner—Charles E. Atkinson
Attorney, Agent, or Firm—Antonelli, Terry & Wands

[57] ABSTRACT

A Viterbi algorithm error correcting decoder is configured of a trellis of branch-distance circuits each of which is formed of sets of diode and controlled interconnecting switches. During a respective bit time of the signal to be decoded, the branch-distance circuits are controlled so as to connect a number of diodes in each branch of the trellis proportional to the distance of the diode branch of interest to the received code branch. Due to the nonlinear voltage-current characteristic of a diode, only the path through the trellis of the branch-distance circuits having the minimum distance from the received data will draw current. Detection of this current-carrying path is used to implement the Viterbi algorithm decoder.

36 Claims, 12 Drawing Figures

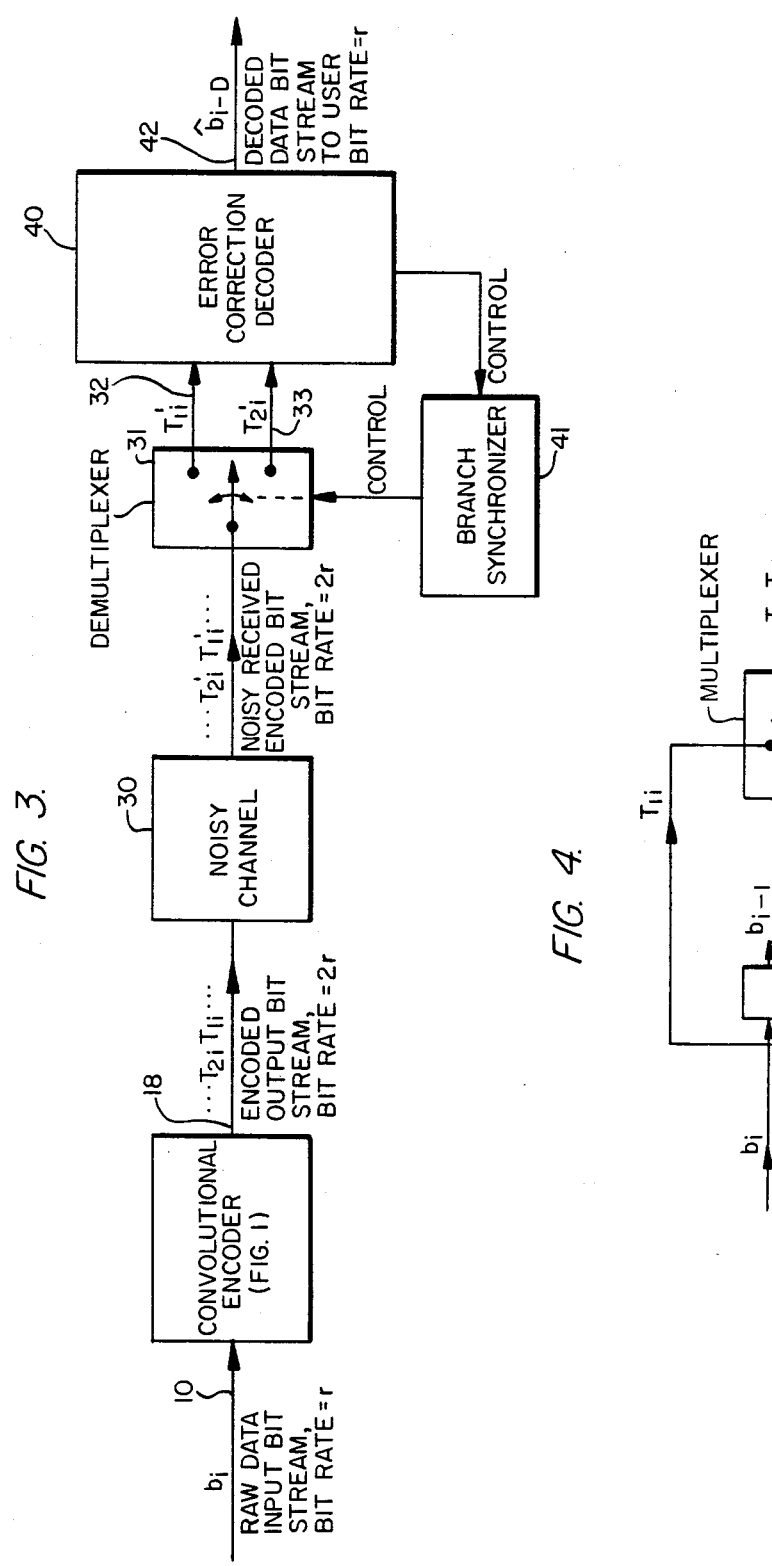

FIG. 7.
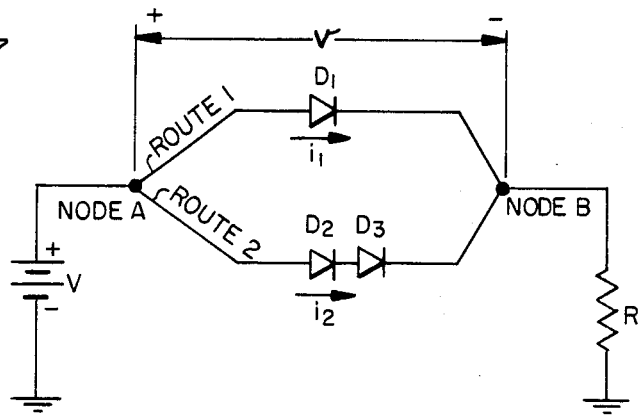
FIG. 8.
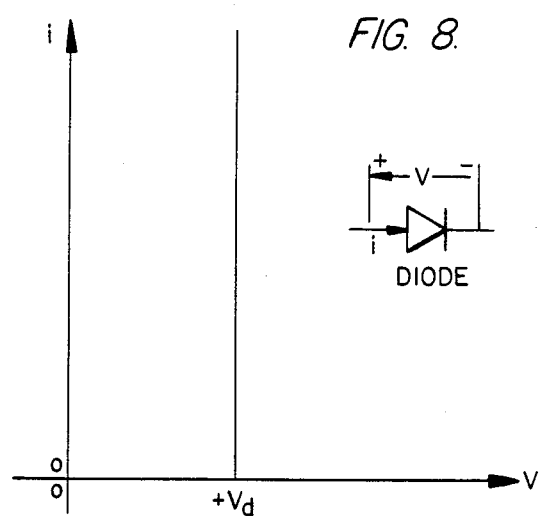
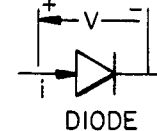
FIG. 9.
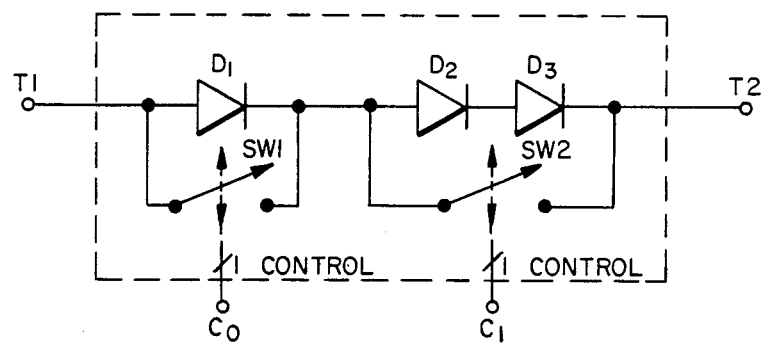

$d(e_{1i}, e_{2i})$

| $e_{1i}$ \ $e_{2i}$ | 0 | 1 | 2 | 3 | 4 | 5 | 6 | 7 |
|---|---|---|---|---|---|---|---|---|
| 0 | 0 | 0 | 0 | 0 | 0 | 1 | 1 | 2 |
| 1 | 0 | 0 | 0 | 0 | 0 | 1 | 1 | 2 |
| 2 | 0 | 0 | 0 | 0 | 0 | 1 | 1 | 2 |
| 3 | 0 | 0 | 0 | 0 | 0 | 1 | 1 | 2 |
| 4 | 0 | 0 | 0 | 0 | 0 | 1 | 1 | 2 |
| 5 | 1 | 1 | 1 | 1 | 1 | 2 | 2 | 3 |
| 6 | 1 | 1 | 1 | 1 | 1 | 2 | 3 | 3 |
| 7 | 2 | 2 | 2 | 2 | 2 | 3 | 3 | 3 |

DIODE-CONFIGURED VITERBI ALGORITHM ERROR CORRECTING DECODER FOR CONVOLUTIONAL CODES

FIELD OF THE INVENTION

The present invention relates in general to digital communication systems, and is particularly directed to a Viterbi algorithm decoder for convolutional error-correction codes.

BACKGROUND OF THE INVENTION

The objective for all error correction coding/decoding techniques is to provide, at the digital data receiver, an ability to correct errors introduced into the digital bit stream when the data is transmitted over a noisy communication channel. This objective may be accomplished by suitable encoding of the digital data stream by an error-correction coder prior to transmission over the channel. Then, at the receiver end of the communication channel, an error correction decoder is employed to map the received coded data back into the original information bit stream. If not too many errors occur in the channel, this decoding process at the receiver produces error-free data reception, even though some errors are introduced into the coded bit stream as it passes through the noisy communication channel.

Where the error correction coding scheme at the transmitter takes the form of a convolutional encoding technique, a decoding procedure, known as a Viterbi algorithm decoder, has been found to be particularly attractive for recovering the transmitted digital data from a receiver of a noisy bit stream. For an overview of the Viterbi algorithm attention may be directed to articles by A. J. Viterbi entitled "Error Bounds for Convolutional Codes and an Asymptotically Optimum Decoding Algorithm, IEEE Trans. Inform. Theory, Vol IT-13, pp. 260–269, April, 1967, and "Convolutional Codes and Their Performance in Communication Systems," IEEE Trans. Commun. Technol., Vol. COM-19, pp 751–722, October 1971 and an article by G. D. Forney entitled "The Viterbi Algorithm," Proc. IEEE, Vol. 61, pp 268–278, March 1973.

Of the signal processing techniques that have been developed to date for implementing the Viterbi Algorithm, all are essentially digitally based schemes, requiring the interfacing of a number of different functional components, resulting in a decoding system that is both costly and complicated. For an illustration of such proposals attention may be directed to the U.S. Pat. No. 4,015,238 to Davis; Clark et al U.S. Pat. No. 3,789,360; Melvin U.S. Pat. No. 4,087,752; and Acampora U.S. Pat. No. 4,087,707.

SUMMARY OF THE INVENTION

In accordance with the present invention, a significant departure from the digital approach of conventional Viterbi algorithm decoder has been developed. The present invention involves what is essentially an analog hardware configuration comprised of a diode-switch-trellis network, that effectively executes the solution to a shortest route problem in the decoding process. In its basic configuration, the novel decoder of the present invention contains a trellis of branch-distance circuits each of which is formed of sets of diodes and controlled interconnecting switches. During a respective bit time, the branch-distance circuits are controlled so as to connect a number of diodes in each branch of the trellis proportional to the distance of the diode branch of interest to the received code branch. Due to the nonlinear voltage-current characteristic of a diode, only the path through the trellis of the branch-distance circuits having the minimum distance from the received data will draw current. Because of the simplicity of the components of which the branch-distance trellis network is formed, the present invention is readily implemented using a large scale integrated circuit (LSI) chip.

BRIEF DESCRIPTION OF THE DRAWINGS

FIG. 3 is a block diagram of digital data transmission system controlling convolutional encoder, transmission channel, and receiver/decoder;

FIG. 4 is a block diagram of rate $\frac{1}{2}$, n=1 convolutional encoder;

FIG. 7 shows a two-path, two-node diode network for finding the minimum distance path between two nodes;

FIG. 8 shows the typical current vs. voltage characteristic of a zener diode;

FIG. 9 shows the basic circuit configuration of a branch distance circuit;

DETAILED DESCRIPTION

In order to facilitate an understanding of the present invention, a brief discussion of convolutional encoding and the use of the Viterbi algorithm will initially be presented. For further details on such encoding techniques attention may be directed to the above-referenced literature.

Figure 1:
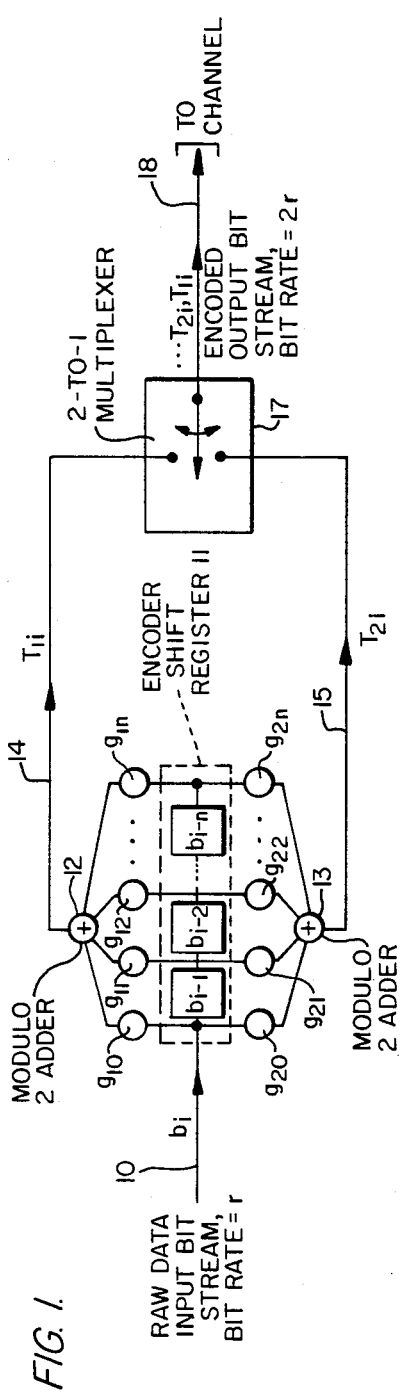
FIG. 1 shows a block diagram of a generalized convolutional encoder employed at a transmitter site.

FIG. 1 shows a general convolutional encoder used to encode the data at the transmitter prior to passing the signal through the communication channel. Raw data bits from the original information source are presented serially over data input line 10 to an n-stage binary encoder shift register 11 for encoding. As shown in FIG. 1, the $i^{th}$ bit $b_i$ in the serial input bit stream is entering stage 1 of the encoder register. Prior bits $b_{i-1}, b_{i-2}, \ldots, b_{i-n}$ are still in stages $z_{i-1} \ldots z_{i-n}$ of the encoder shift register 11. These bits are connected to two modulo-2 adders 12 and 13 to form two output bits, $T_{1i}$ and $T_{2i}$ on lines 14 and 15, respectively. These bits may be mathematically described as follows:

$$T_{1i} = \left( \sum_{k=0}^{n} g_{1k} b_{i-k} \right) \text{Modulo-2} \tag{1}$$

$$T_{2i} = \left( \sum_{k=0}^{n} g_{2k} b_{i-k} \right) \text{Modulo-2} \qquad (2)$$

where $g_{1k}=0$ if $b_{i-k}$ is not connected to Mod 2 adder 12,
$g_{1k}=1$ if $b_{i-k}$ is connected to Mod 2 adder 12,
$g_{2k}=0$ if $b_{i-k}$ is not connected to Mod-2 adder 13, and
$g_{2k}=1$ if $b_{i-k}$ is connected to Mod-2 adder 13.

The $g_{lk}$ coefficients for a specific code thus determine which bits in the encoder register are connected to the modulo-2 adders. The sets of connection coefficients are often defined as generator polynomials for the convolutional code, i.e.

$$g_1(x) = \sum_{k=0}^{n} g_{1k} x^k \qquad (3)$$

and $$g_2(x) = \sum_{k=0}^{n} g_{2k} x^k \qquad (4)$$

would be the two generator polynomials for the general rate $\frac{1}{2}$ code shown in FIG. 1.

For each bit time a new $b_i$ bit is presented to the encoder, two new bits, $T_{1i}$ and $T_{2i}$, are produced, and the multiplexer 17 is switched to pass first $T_{1i}$, then $T_{2i}$ sequentially out of the encoder over output line 18 for transmission over the channel. The code rate of the convolutional encoder is defined as the ratio of the uncoded input bit rate to the coded output rate and, for the example in FIG. 1, the code rate is $\frac{1}{2}$. Thus, the output bit rate is twice the input bit rate in the encoder of FIG. 1.

Other code rates are possible: for example, by including a third modulo-2 adder, a third set of connection coefficients or generator polynomial and a 3-to-1 multiplexer in place of 2:1 multiplexer 17, a $\frac{1}{3}$ code rate is obtained wherein the output bit rate is three times the input bit rate. To simplify the present discussions only rate $\frac{1}{2}$ convolutional encoders of the type shown in FIG. 1 will be considered.

Other terms to be defined to facilitate further discussion of the convolutional codes are as follows. The constraint length, K, of the convolutional code is defined as $$K = n + 1. \qquad (5)$$

The constraint length thus defines the span of input bits which influences the encoder output.

Another very useful concept for convolutional codes is that of the state of the encoder. The state of the encoder at bit time i will be defined as $S_i$, where $$S_i = \sum_{k=1}^{n} b_{i-k} 2^{k-1} \qquad (6)$$

From equation (6) it is seen that the state of the encoder is simply the binary number representation of the last n input bits stored in the encoder shift register 11. The encoder can thus be viewed as a finite state machine with the number of states defined as $N_s$ given by $$N_s = 2^n \qquad (7)$$

The output bits $T_{1i}$ and $T_{2i}$ from the encoder are obviously determined when $b_i$ and $S_i$ are given, since all the bits defining the outputs in equations (1) and (2) are then known. Also, it can be seen that given $S_i$ and $b_i$, $S_{i+1}$ can be determined, that is, the state to which the encoder will advance on the next bit time, because of the insertion of $b_i$ into the encoder shift register 11. Mathematically, the new state $S_{i+1}$ resulting from the insertion of $b_i$ into the register (hence pushing $b_{i-n}$ out) can be defined by $$S_{i+1} = (2 \times S_i + b_i) \text{ Modulo-}2^n \qquad (8).$$

Equation (8) defining state transitions leads to one of the most useful graphic description of convolutional codes for understanding the decoding process to be described later. This graphic description is known as a trellis diagram and is obtained by plotting the encoder state, $S_i$, at bit time i versus i for all possible sequences of bits, ($b_i$).

Figure 2:
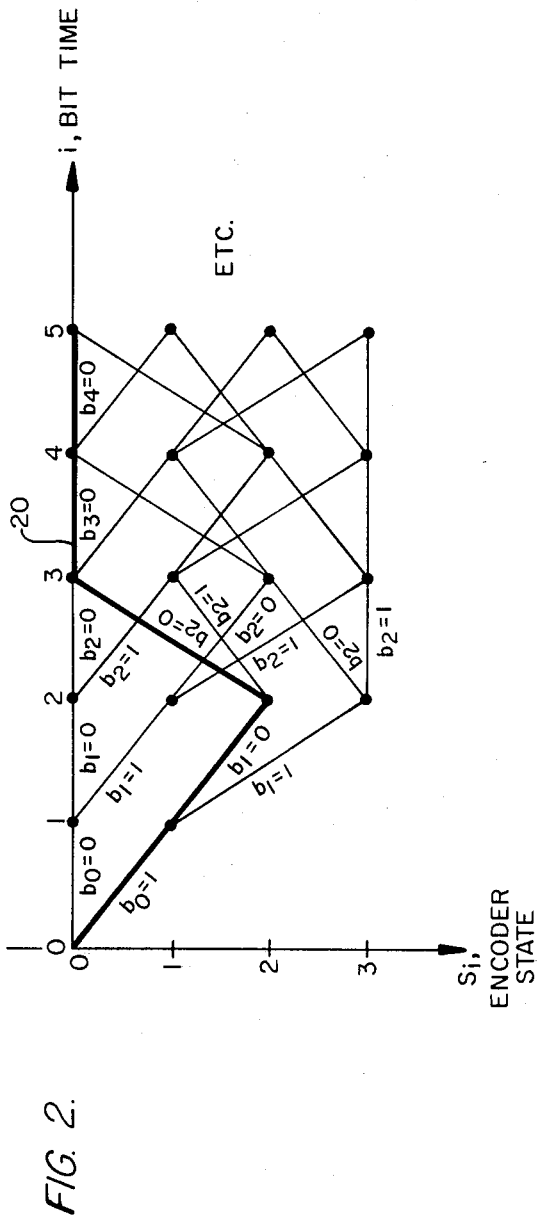
FIG. 2 is a trellis diagram illustration of the transitions in encoder state values for successive bit times.

FIG. 2 shows an exemplary trellis diagram for an n=2 code for which there are four possible states: 0, 1, 2, and 3. In FIG. 2, it has been assumed that at i=0 the encoder is in state 0, i.e., $S_o=0$. All possible state transition paths through this trellis diagram thus emanate from state 0 at i=0. The particular sequence of encoder states encountered, as data bit encoding proceeds from i=0, depends, through Equation (8), on the particular sequence of data bits, ($b_0, b_1, b_2, \ldots$), presented to the encoder by the data source. In FIG. 2, the path followed by the sequence of bits, ($b_0=1, b_1=0, b_2=0, b_3=0, b_4=0$) is accentuated by heavy solid line 20. Along this path it can be seen (and calculated from equation (8)) that the sequence of encoder states encountered ($S_0, S_1, S_2, S_3, S_4, S_5$) is (0, 1, 2, 0, 0, 0). Likewise, a path through this trellis diagram can be traced for any other sequence of input data bits. Thus all possible sequences of encoder states versus bit time are contained in and represented by a trellis diagram continuing ad infinitum for positive time.

The trellis diagram representation for convolutional codes will assist in understanding the functioning of the novel decoder of the present invention to be detailed below. However, several other comments should first be made about the properties of this trellis diagram. First, it should be noted that every line, or branch, connecting the encoder states in the trellis diagram can be labeled with the input data bit causing the state transition to occur. This has been shown in FIG. 2 by indicating below a number of the branches the value of $b_i$ corresponding to that particular branch. Secondly, note that each branch may also be labeled with the two coded bits, $T_{1i}$ and $T_{2i}$, from Equations (1) and (2), that are produced by the encoder as each branch of the code is produced. Such labels have not been included in FIG. 2 to avoid cluttering the diagram. However, it should be observed that the trellis diagram is a complete description of the encoding process, indicating bits input to the encoder and the corresponding coder output bits placed on the channel at each bit time.

Another property of the code paths contained in the trellis diagram that is useful in the present discussions is that of merging. From FIG. 2 it can be seen that from each state, two branches emanate (corresponding to $b_i=0$ and $b_i=1$ respectively in Equation (8)). Also, it should be noted that two different branches converge on each state. This convergence or merging of paths occurs because of the independence of state $S_{i+1}$ on $b_{i-n}$, the bit that is pushed out of the encoder register 11 in FIG. 1 as the new bit $b_i$ is inserted into the encoder register 11.

With the trellis diagram representation for convolutional encoding having been briefly described a discussion of the decoding of such codes at the receiver will next be presented.

FIG. 3 is a consolidated block diagram of an overall digital data transmission system and illustrates the problem that the decoder for the convolutional code described above with the trellis diagram of FIG. 2 encounters at the receiver. As shown, the encoded bit stream on output link 18 from the convolutional encoder passes through a noisy communication channel 30 which includes the modulator at the transmitter, the demodulator at the receiver, and the interconnecting noisy link between transmitter and receiver. For simplicity, only binary quantization at the receiver where hard decisions are made on (the bit rate=2r) encoded bits transmitted over the channel will be considered. Because of the noise introduced in the channel, the encoded bits at the receiver are occasionally in error, and it is the task of a decoder 40 to determine the transmitted raw data bit stream in the face of such errors. In FIG. 3 the received encoded bit stream bits have been indicated as possibly differing from those transmitted by the primed quantities, $T'_{1i}$ and $T'_{2i}$. In general, for hard decision decoding $$T'_{1i} = T_{1i} \oplus e_{1i} \qquad (9)$$

and $$T'_{2i} = T_{2i} \oplus e_{2i} \qquad (10)$$

where $e_{1i}, e_{2i} = 1$, if an error is made in the reception of the $i^{th}$ bit.

$e_{1i}, e_{2i} = 0$, if no error is made on the $i^{th}$ bit, and $\oplus$ denotes modulo-2 addition.

As shown in FIG. 3, the serially received $T'_{1i}$ and $T'_{2i}$ bits are separated by a demultiplexer 31 with a pair of $T'_{1i}, T'_{2i}$ bits being coupled over lines 32 and 33 (at rate r) to the decoder 40. The correct demultiplexing of the bits for application into the decoder 40 is effected by circuitry called a branch synchronizer 41 in practical hardware implementations. The understanding of the operation of the branch synchronizer 41 is nonessential to the understanding of the decoding process currently being explained, so it will not be discussed here. (It will be described below in conjunction with the description of the novel decoder of the invention.)

It is assumed that the demultiplexer 31 has been controlled to cause $T'_{1i}$ bits to always appear on the upper demultiplexer output line 32 and $T'_{2i}$ bits on the lower demultiplexer output line 33 as shown in FIG. 3. Thus, at a rate=r per second, a pair of possibly errored coded bits $T'_{1i}$ and $T'_{2i}$ for raw data bit time=i is presented to the decoder 40, and the decoder 40 is expected to produce on its output 42 an estimate of the raw data bit at time i−D, where D is the number of bit times of decoding delay allowed to the decoding process. The bit estimate is labeled $b_{i-D}$ in FIG. 3 and these estimates emerge from the decoder 40 at bit rate=r and are passed to the user.

In the discussion of the operation of the error-correction decoder to follow, the utility of the trellis diagram representation of FIG. 2 for the convolutional encoder in understanding the operation of the decoder will become very evident. Most simply stated, the task of the decoder 40 is to fine the path through a trellis diagram like that in FIG. 2 having the sequence of encoded bits, $(T_{1i},T_{2i})$, that best matches the sequence of actually received noisy encoded bits, $(T'_{1i},T'_{2i})$. This path is the one most likely to have been transmitted since it requires hypothesizing the smallest number of errors as having occurred in transmission through the channel. With independent errors occurring from bit time to bit time on the channel (as is often the case for practical channels) the path requiring the hypothesis of the smallest number of errors is the maximum likelihood path to have been transmitted. The Viterbi Algorithm for decoding convolutional codes is a technique for finding the path through the trellis diagram that is best matched to the received data represented by the $(T'_{1i},T'_{2i})$ branch pairs bit sequence and the number in which this algorithm is implemented will be described below. After determining the path best matched over the span from bit time i−D to bit time i (D is the allowed decoding delay) the bit, $b_{i-D}$, in the oldest position of this path is selected by the decoder as the output decision, $b_{i-D}$.

In order to better appreciate some of these operations the decoding of the specific n=1 code having an encoder shown in FIG. 4 and a trellis diagram shown in FIG. 5 will be described. The encoder of FIG. 4 has the two generator polynomials $g_1(x)=1$ and $g_2(x)=1+x$. As shown by the trellis diagram of FIG. 5, for this code, there are only $2^n = 2^1 = 2$ encoder states $S_i$ possible for each bit time i. On the trellis diagram each state transition branch has been labeled below the line with $b_i$ and with the $T_{1i},T_{2i}$ encoded bit pair labeled above the line.

The manner in which the Viterbi algorithm decoder locates the minimum distance path through the trellis diagram for this n=1 code shown in FIG. 4, and thus accomplishes the decoding of the information will be explained with reference to FIG. 6. At the top of the trellis diagram is an indication, for each branch of the diagram, of the bit time, i; an assumed sequence of raw data bits, $b_i$, for each bit time; the corresponding encoded bits, $T_{1i}T_{2i}$; an exemplary set of errors, $e_{1i},e_{2i}$; and finally, the resulting errored encoded bits, $T'_{1i},T'_{2i}$. Note that in this example a single error, that is, $e_{10}=1$, in receiving $T_{10}$ is assumed.

Figure 6:
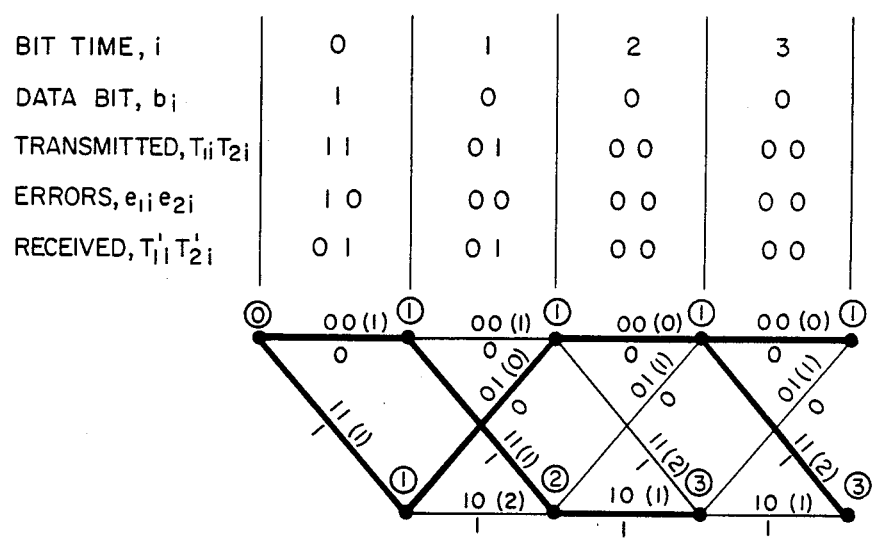
FIG. 6 is a diagram showing the decoding process for a trellis diagram of FIG. 5.

On each branch of the trellis diagram in FIG. 6, there is an indication, by the number in parentheses, of the distance (i.e., the number of errors) between the received branch, $T'_{1i},T'_{2i}$ and the $T_{1i},T_{2i}$ pair for that branch of the trellis. The objective of the decoder is to find the path through the trellis with the least accumulated distance relative to the entire received sequence of $T'_{1i},T'_{2i}$ bit pairs. In FIG. 6, each state node of the diagram is labeled by a circled number indicating the smallest accumulated distance for a path into each of the state nodes. Thus, the path into each state producing the minimum accumulated distance up to that state has been emphasized.

A key point in the operation of the Viterbi Algorithm decoder is that once two paths converge on a common state node in the trellis diagram, the larger distance path into that state node can be eliminated from further consideration as a candidate for the smallest distance path through the continuing trellis diagram. This occurs because further identical extensions from that common state are indicated for both paths and thus there is no way for the larger distance path at the common node to subsequently overcome a distance disadvantage relative to some other path at the common state node.

On the basis of the above description, the Viterbi decoding algorithm of prior art implementations can be explained succinctly as follows. At each data bit time i, the decoder has stored in $2^n$ memory locations the smallest accumulated distance (called survivor distance) at each of the $2^n$ states of the trellis diagram. Upon the receipt of the next $T'_{1i}, T'_{1i}$ branch the distance between $T_{1i}, T_{2i}$ for each branch of the trellis is computed. These branch distances are analogous to the numbers in parentheses in FIG. 6. Next, two competing distances at each node are computed by adding the appropriate present branch distances to the appropriate stored survivor distance. The smallest of these two competing distances is stored as the new surviving distance at the state node. The survivor distances are analogous to the circled numbers in FIG. 6. One bit is also stored for each node to indicate whether the upper or lower of the two transitions into the node produced the survivor distance. Conceptually, this bit, termed a trellis connection bit indicates which of the two transitions into the state to emphasize in FIG. 6 as still being contained along a candidate path for the minimum distance path through the overall trellis diagram.

The $2^n$ trellis connection bits are stored in standard implementations for each of the D branch times, where D is the allowed decoding delay. Thus standard implementations of the Viterbi algorithm decoder required circuitry for storing $2^n$ survivor distances as well as $2^n \times D$ trellis connection bits. In addition, digital add-compare-select circuitry must be provided to update the survivor distances each bit time, and further, circuitry must be provided to traceback along the minimum distance path through the D branches of trellis connection bits to determine the decoder's output decision, $b_{i-D}$, along this path.

This traceback operation can be understood with reference to FIG. 6 by noting that after branch 3 is processed, state 0 has the minimum distance path (distance = 1). Tracking backwards from this state 0 at branch 3 along emphasized branches leads to $b_0 = 1$ at branch 0 and the output decision from the decoder is thus determined. This is the way Viterbi algorithm decoders have typically been implemented in the prior art, i.e., by digital circuitry performing the survivor metric updating and storage function, by calculation of the trellis connection bits and storing them, by determining smallest distance path state at each branch time and then digital implementation of the traceback process to ascertain a decoder output bit decision from this minimum distance path. Many refinements have been made to these operations to simplify hardware, but the basic decoder operation has remained essentially the same digital processing scheme in most prior art implementations. As mentioned previously, however, and as will be described in detail below, the present invention involves a new and improved technique for Viterbi decoding that uses an analog circuit based on the concept of finding the shortest route through the trellis diagram.

FIG. 7 shows a basic two-path, two-node network configured to find the shortest of two routes between the two nodes A and B. Route 1 is assumed to have distance = 1 and Route 2 has distance = 2. Diode $D_1$ is provided in Route 1, while diodes $D_2$ and $D_3$ are provided in Route 2. The number of diodes in each path is proportional to the distance of each path. The diodes, $D_1$, $D_2$ and $D_3$ are each assumed to have the zener current versus voltage characteristic shown in FIG. 8 which is an approximation of the characteristic of real semiconductor diodes. This characteristic shows that the diode does not conduct current until the voltage exceeds $V_d$. Also, as shown in FIG. 8, the voltage across a conducting diode is clamped at $V_d$ volts.

Returning to the circuit of FIG. 7 which contains diodes with the characteristic in FIG. 8, one notes that only Route 1 will draw current, i.e.

$$i_1 = \frac{V - V_d}{R} \qquad (11)$$

and $$i_2 = 0. \qquad (12)$$

When diode $D_1$ conducts, v is clamped to $V_d$ and this voltage is impressed across the two series-connected diodes $D_2$ and $D_3$ in Route 2. Since the two series connected diodes $D_2$ and $D_3$ would require $v = 2V_d$ to conduct, they remain in the nonconducting state. Thus, it can be seen that only the shortest route path (i.e. the path containing the smallest number of diodes) between Nodes A and B will conduct current in the circuit of FIG. 8. Accordingly, it is only necessary to detect which path is drawing current (or, the most current with realistic diodes) to solve the shortest route problem.

In accordance with the present invention, described in detail below, the property that only the minimum diode path in a network draws current is advantageously incorporated in a signal processing network to find the minimum distance path in the trellis diagram for a convolutional code as a means of implementing a Viterbi Algorithm decoder. For a general overview on the use of diode networks to solve mathematical programming problems, attention may be directed to "Mathematical Programming and Electrical Networks" by Jack B. Dennis, MIT Technology Press and John Wiley and Sons, Inc. 1959.

As pointed out previously, by using the novel analog scheme of the present invention, the complicated and costly circuit refinements that have been developed to date in digital signal processing approaches are obviated by making use of the shortest route technique and integrating that scheme in a practical hardware implementation. For this purpose, the present invention is comprised essentially of an analog hardware arrangement of a plurality of fundamental circuits termed branch distance circuits as shown in FIG. 9. Pursuant to the invention, this circuit is employed on each trellis diagram branch to define the distance between the $T_{1i}, T_{2i}$ branch bit pair produced by the encoder at the transmitter and the received branch bit pair $T'_{1i}, T'_{2i}$ derived from the noisy channel.

As shown in FIG. 9, the branch distance circuit contains series connected diodes $D_1$, $D_2$ and $D_3$ with a first controlled switch SW1 connected across diode $D_1$ and a second controlled switch SW2 connected across the series connection of diodes $D_2$ and $D_3$. Switches SW1 and SW2 are opened or closed in response to respective control bits $C_0$ and $C_1$, so that the appropriate number of diodes equal to the branch distance are connected between the terminals T1 and T2.

Figure 5:
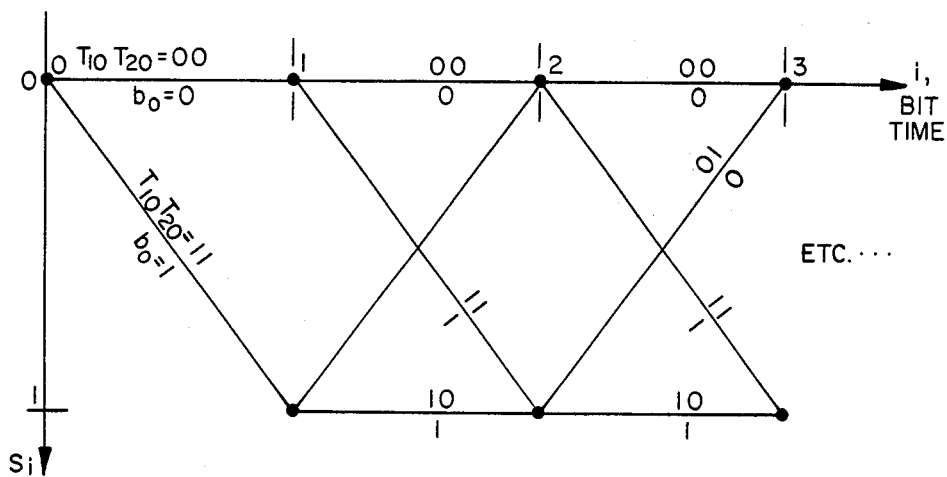
FIG. 5 is a trellis diagram of the transitions in encoder state values for successive bit times for the convolution encoder of FIG. 4.
Figure 10:
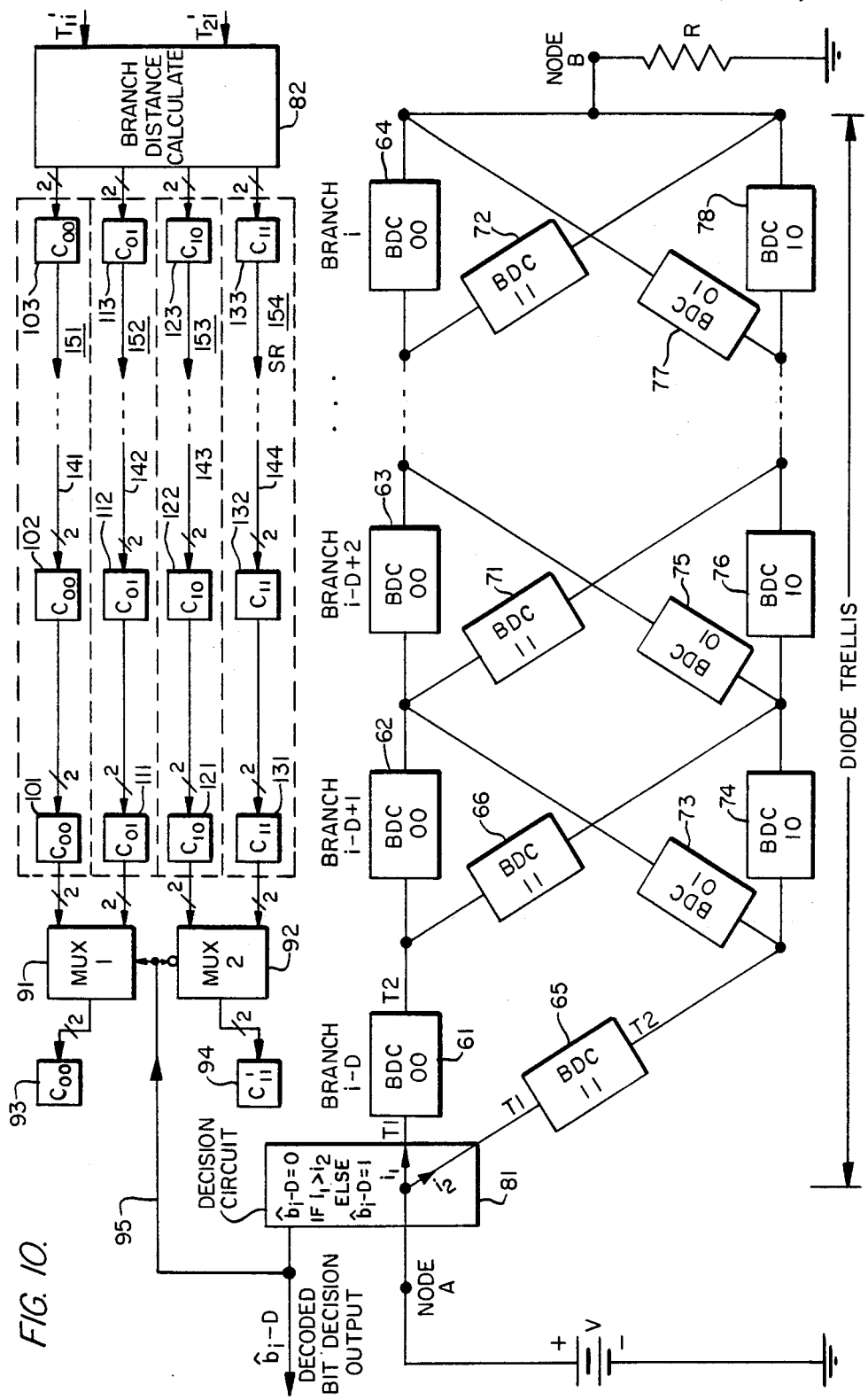
FIG. 10 is a schematic block diagram of a shortest-route Viterbi algorithm decoder in accordance with the present invention.

FIG. 10 shows the manner in which the basic Branch Distance Circuits (BDCs) are used to construct a network for finding the shortest route (minimum distance path) through the n=1 trellis diagram of FIG. 5. This network makes use of the fact that only the shortest route path through the network connected between Nodes A and B will draw current. The principle is the same as for the case shown in FIG. 7, but in FIG. 10 the network connected between Nodes A and B has been replaced with the complex diode trellis diagram circuit wherein each branch contains a BDC as shown in FIG. 9.

As shown in FIG. 10, the network is comprised of a trellis of branch distance circuits 61–78 connected between Nodes A and B which are coupled to sources of respectively different potentials. Control of the switch inputs of each circuit is obtained for the respective stages 101–133 of shift registers 151–154, which are disposed in output links 141–144 of a branch distance calculation circuit 82 to which the receive noisy channel signals $T'_{1i}$ and $T'_{2i}$ are applied. Branch distance calculation circuit 82 operates on the unknown incoming signals $T'_{1i}$ and $T'_{2i}$ from the noisy channel and produces sets of binary outputs on links 141–144 representative of the successive data values. For this purpose circuit 82 may comprise a two level decision from this, such as a hard limiter circuit, or a multilevel soft decision function, described below. Links 141 and 142 are coupled to multiplexer 91 the output of which is coupled to control bit register 93, while links 143 and 144 are coupled to a multiplexer 92 the output of which is coupled to a control bit register 94. Each of multiplexers 91 and 92 is switchably controlled by a signal on link 95 from a bit decision circuit 81. Each BDC is also labeled by the $T_{1i},T_{2i}$ bit pair for the branch. For purposes of clarity, FIG. 10 does not show the control bit connections ($C_0$, $C_1$ in FIG. 9). However, each BDC for a branch is connected to these 2-bit controls which are stored in the $C_{lm}$ register stages 101–133 for the branch at the top of the diagram in FIG. 10. BDC lm is controlled by the 2-bit number, $C_{lm}$.

The operation of the decoder in FIG. 10 is as follows. At each bit time, the received code branch, $T'_{1i},T'_{2i}$, is input to the Branch Distance Calculator 82. The Branch Distance Calculator 82 computes the distances of the received branch, $T'_{1i},T'_{2i}$, from each of the four possible code branches, $T_{1i},T_{2i}$=00, 01, 10, and 11 and outputs these 2-bit distances as $C_{00}$, $C_{01}$, $C_{10}$, and $C_{11}$, respectively, over links 141–144, to control the BDCs 61–78. This set of eight control bits is input to stages 103–133 of shift registers 151–154 which store the D most recent sets of these control bits. Through the control connections from shift registers 151–154 to the BDCs 61–78, the diode trellis network is reconfigured at each data bit time to contain a number of diodes on each branch of the trellis network equal to that branch's distance from the received code branch.

After a new set of control bits $C_{00}$, $C_{01}$, $C_{10}$, $C_{11}$ is clocked into shift registers 151–154 and all the BDC's switches are controlled, the two diverging currents $i_1$ and $i_2$ at the "oldest" end of the trellis (at Node A) are compared in bit decision circuit 81, and a decision is made by the decision circuit 81 on which of the two branches is drawing the most current. If the diodes comprising the BDC's had the ideal characteristic shown in FIG. 8, only one of the currents would be non-zero and would correspond to the shortest route path through the trellis. To allow for nonideal diodes, the decision circuit 81 is constructed of comparator circuitry to implement the decision on $b_{i-D}$ as $$b_{i-D} = 0, \text{ if } i_1 > i_2, \quad (13)$$
$$= 1, \text{ otherwise.}$$

The decision on $b_{i-D}$ is coupled over output link 95 to the user as the decoded output bit. It is also connected to multiplexers 91 and 92 for multiplexing the proper control bits to control branch i−D BDC's on the next bit time, as pointed out above. Multiplexers 91 and 92 are required since if $b_{i-D}=0$ (i.e., $i_1$ $i_2$) then on the following bit time the upper state 0 node must be conceptually "pulled over" and connected to Node A. In this case, $(C'_{00})_{i-D}=(C_{00})_{i-D+1}$ and $(C'_{11})_{i-D}=(C_{11})_{i-D+1}$. If, however, $b_{i-D=1}$ (i.e., $i_1<i_2$) then on the following bit time the lower state 1 node must be conceptually "pulled over" and connected to Node A. In this case $(C'_{00})_{i-D}=(C_{01})_{i-D+1}$ and $(C'_{11})_{i-D}=(C_{10})_{i-D+1}$. Multiplexers 91 and 92 are necessary, therefore, to continue following the shortest route through the trellis based on prior decisions.

On the next bit time, a new received branch $T'_{1(i+1)},T'_{2(i+1)}$ pair in input to the decoder and new control bits are produced from branch distance calculation circuit 82 and input to register stages 103–133, all control bit registers shift to the left thus advancing the trellis diagram one branch further along the received sequence, and the decoding operation repeats.

The circuitry shown in FIG. 10, for n=1, provides an analog network that accomplishes almost all of the functions required of a Viterbi Algorithm decoder for convolutional codes. Advantageously, the network is fairly simple, consisting primarily of many controllable analog Branch Distance Circuits (BDC's) as shown in FIG. 9. Each is made up of three diodes and two single pole-single throw switches. Auspiciously this structure lends itself readily to implementation on an integrated circuit (IC) with semiconductor diodes and switches, so that the entire Viterbi Decoder may be configured in a single IC package and capable of operating at very high bit rates.

The Viterbi Algorithm decoder is obtained with this simple shortest route diode circuitry without the requirement for the more complicated digital add-compare-select circuitry for updating survivor metrics in each state, trellis connection storage, and traceback circuitry required in prior art implementations of this algorithm.

It will be recalled from the description of FIG. 3 that the decoding scheme for the channel employs a branch synchronizer for operating the received channel demultiplexer in response to the output of the error correction decoder. This is accomplished with the decoder of FIG. 10 in the following way. Note that the voltage drop across the diode trellis from node A to node B is proportional to the number of diodes (i.e., distance) in the minimum distance path through the trellis. Thus the voltage across the trellis at each bit time serves as an indication of the reliability of decoding. Low voltage indicates that not many channel errors exist on the minimum distance path. Thus, if the branch synchronization is improper, the average voltage across the trellis will be high due to the algorithm's inability to find a path through the trellis having a small distance from the erroneously synchronized branches input to the decoder. Therefore, the branch synchronizer demultiplexer in FIG. 3 is controlled such that $T'_{1i},T'_{2i}$ pairs are presented to the decoder in the manner that the average trellis voltage drop remains below some predetermined threshold.

It is also possible to use a quantized version of the instantaneous trellis voltage at each bit time to provide a reliability of decoding indication for each decoded bit, since that voltage is proportional to the distance of the minimum distance code path in the trellis from the received sequence.

To determine the complexity of the diode trellis Viterbi decoder as a function of the n parameter of the encoder, it is necessary to compute the number of diodes, switches and control bit register elements used. Taking into account the reducing number of BDC's for the n branches at the oldest end of the trellis where the number of branches is halving for each older branch, the total number of BDC's, $N_{BDC}$, is given by $$N_{BDC} = (D - n + 2)2^{n+1} - 2 \qquad (14)$$

It has been found experimentally that the decoding delay $D = 6n$, produces almost all the performance capability of the decoder. Thus assuming $D = 6n$, Equation (14) becomes:

$$N_{BDC} = (5n + 2)2^{n+1} - 2. \qquad (15)$$

Since each BDC requires three diodes and two switches (as seen in FIG. 9), the number of diodes, $N_d$, and number of switches $N_s$, required to implement the decoder are:

$$N_d = 3N_{BDC} = 3(5n + 2)2^{n+1} - 6 \qquad (16)$$

and $$N_s = 2N_{BDC} = 2(5n + 2)2^{n+1} - 4, \text{ respectively.} \qquad (17)$$

Considering that each branch of decoding depth in the trellis requires 8 bits of storage (the 4, 2-bit quantities $C_{00}$, $C_{01}$, $C_{10}$, $C_{11}$ in FIG. 10) and disregarding any small savings that may occur as control bits are multiplexed at the oldest end of the trellis as in MUX 1 and MUX 2 in FIG. 10, the number $N_R$ of register bits required is:

$$N_R = 8(D + 1) \qquad (18)$$

Again, assuming that D, the decoding delay is 6n, equation (18) becomes:

$$N_R = 8(6n + 1) \qquad (19)$$

In Table 1, there are tabulated $N_d$, $N_s$, and $N_R$ from Equations (16), (17) and (19), respectively versus n, the encoder memory (which is one less than the encoder constraint length). The number of elements required are well within the capabilities of present Large Scale Integration (LSI) techniques. The $n = 6$ decoder (which is about the largest n, high bit rate, error correcting Viterbi decoder presently commercially available, requires 12,282 diodes; 8,188 semiconductor switches; and 296 bits of register storage, which is readily implemented on a single LSI chip using present LSI technology.

TABLE 1

Number of Elements Required to Implement the Diode Trellis Viterbi Decoder for n = 1 to 7.

| Encoder Memory, n | # Diodes $N_d$ | # Switches $N_s$ | # Bits Storage $N_R$ |
|---|---|---|---|
| 1 | 78 | 52 | 56 |
| 2 | 282 | 188 | 104 |
| 3 | 810 | 540 | 152 |
| 4 | 2,106 | 1,404 | 200 |
| 5 | 5,178 | 3,452 | 248 |
| 6 | 12,282 | 8,188 | 296 |
| 7 | 28,410 | 18,940 | 344 |

Note:
Decoding delay, D, is assumed to be 6n. K = n + 1.

In the above description of the diode trellis Viterbi decoder it has been assumed that hard decisions (i.e., binary quantization) were carried out by decision circuit 82 on the received code branch bit pairs, $T'_{1i}, T'_{2i}$. Also, it has been assumed that the distance measured for branches is the Hamming distance between the code branch, $T_{1i}, T_{2i}$ in the trellis and the received branch, $T'_{1i}, T'_{2i}$. That is, the branch distance, $d(e_{1i}, e_{2i})$, computed to control the BDC's in the diode trellis has been given by:

$$d(e_{1i}, e_{2i}) = e_{1i} + e_{2i} \qquad (20)$$

where, from Eqs. (9) and (10):

$$e_{1i} = T_{1i} \oplus T'_{1i} \qquad (21)$$

$$e_{2i} = T_{2i} \oplus T'_{2i} \qquad (22)$$

and $e_{1i}$ and $e_{2i}$ are either 0 or 1. From equation (20) it is noted that branch distances can be 0, 1 or 2 depending on the particular values of $e_{1i}$ and $e_{2i}$ for the trellis branch. The Branch Distance Circuit (BDC) shown in FIG. 9 has the capability of producing branch distances 0, 1, 2 or 3, which is one more than necessary for hard decision decoding discussed above. The provision of this excess capability in the BDC's permits extension of the application of this decoder implementation to the case of soft decision quantization of the $T'_{1i}, T'_{2i}$ pairs at the receiver as described below. Soft decision decoding typically can provide about 2 dB better performance than hard decision decoding.

Figures 11, 12:
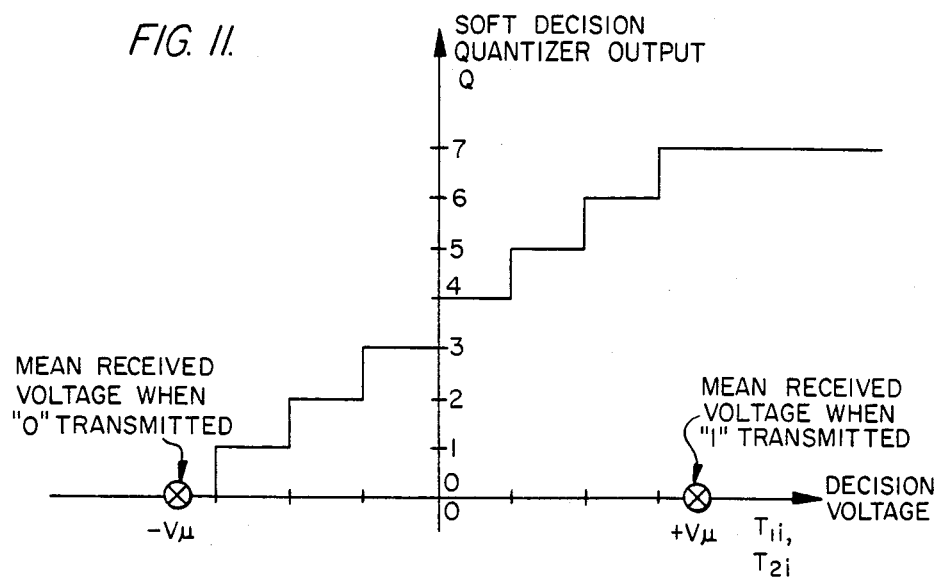
FIG. 11 shows a quantization scheme for an eight-level decision circuit.
FIG. 12 shows a branch distance mapping function for soft decision decoding.

Considering the case of 3-bit (or 8 level) quantization of the $T'_{1i}$ and $T'_{2i}$ decision voltages at the receiver, 8-level quantization of these decision voltages may be represented as shown in FIG. 11. FIG. 11 shows that each received signal voltage for each of the $T'_{1i}$ or $T'_{2i}$ encoded bits is quantized into one of the numbers 0 to 7. In the absence of channel noise, the received signal voltage for a coded bit would lie at the mean level $-V_\mu$ or $+V_\mu$ depending on whether the transmitted coded bits, $T_{1i}$ and $T_{2i}$, are 0 or 1, respectively. The quantizer output number for $T'_{1i}$ will be termed $Q_{1i}$ and the quantizer output for $T'_{2i}$ will be termed $Q_{2i}$. With these definitions, eight-level errors for each of these quantized branch bits may be defined as:

$$e_{1i} = |Q_{1i} - T_{1i}| \qquad (23)$$

$$e_{2i} = |Q_{2i} - T_{2i}| \qquad (24)$$

where x = Absolute value of x.

With the eight-level branch errors $e_{1i}$ and $e_{2i}$ as defined in equations (23) and (24), a branch distance mapping function, d($e_{1i}$, $e_{2i}$), must be determined for each of the 64 possible combinations of $e_{1i}$, $e_{2i}$. FIG. 12 shows a mapping function d($e_{1i}$, $e_{2i}$) table restricted to the set of integers, (0, 1, 2, 3).

Significantly the branch distance mapping, d($e_{1i}$, $e_{2i}$) of FIG. 12, which only employs the integers, 0, 1, 2, 3, performs within 0.25 dB of true eight-level quantization performance and within about 0.5 dB of an unquantized (infinite levels) soft decision scheme. With the mapping of FIG. 12, since only branch distances of 0, 1, 2 or 3 are required, one can use the Branch Distance Circuit of FIG. 9 to effect soft decision Viterbi decoding using the diode trellis shortest route circuit of the present invention.

As will be appreciated from the foregoing description, the trellis-configured diode array approach to a Viterbi algorithm decoder according to the present invention provides a significant reduction in complexity and cost compared to digital processing techniques of previously available decoders. This simplicity and its capability of being implemented using large scale integrated circuit packaging techniques makes the invention a particularly attractive solution to the convolutional code error correcting problem.

While I have shown and described several embodiments in accordance with the present invention, it is understood that the same is not limited thereto but is susceptible of numerous changes and modifications as known to a person skilled in the art, and I therefore do not wish to be limited to the details shown and described herein but intend to cover all such changes and modifications as are obvious to one of ordinary skill in the art.

What is claimed:

1. For use in a digital data communication system wherein information signals transmitted over a communication channel are subjected to convolutional error coding, an arrangement for decoding signals received over said channel comprising:
a plurality of circuit elements, a prescribed electrical characteristic of each of which is controllable, arranged in a prescribed pattern between first and second reference potential nodes;
means, coupled to said plurality of circuit elements, for controlling the constituency of said pattern by said circuit elements in response to signals received over said channel; and
means, coupled to the prescribed pattern in which said plurality of circuit elements are arranged between said first and second reference potential nodes, for generating an output representative of a recovered information signal in accordance with the effective minimum distance path, through said pattern, of current flow between said first and second reference potential nodes.

2. An arrangement according to claim 1, wherein said prescribed pattern of controllable circuit elements comprises a trellis arrangement of diode circuits, each diode circuit comprising at least one diode and a switch coupled therewith.

3. An arrangement according to claim 2, wherein said switch is connected in parallel with said diode in a respective trellis branch and is selectively opened or closed by said controlling means.

4. An arrangement according to claim 1, wherein said prescribed pattern of controllable circuit elements comprises a trellis arrangement of diode circuits, each diode circuit comprising first and second diode circuits coupled in series in a respective branch of said trellis, each diode circuit containing at least one diode and a switch coupled in parallel therewith, said switch being selectively opened or closed by said controlling means.

5. An arrangement according to claim 4, wherein said first and second diode circuits contain diodes having effectively different voltage drops thereacross.

6. An arrangement according to claim 4, wherein said first and second diode circuits contain respectively different numbers of diodes therein.

7. An arrangement according to claim 2, wherein said controlling means includes means for storing signals representative of successively received ones of said received signals and controlling prescribed ones of said diode circuits in accordance with prescribed ones of said stored signals, respectively.

8. An arrangement according to claim 7, wherein said output generating means comprises means, coupled to selected branches of said trellis, for generating an output signal in accordance with which of said selected branches of said trellis draws the largest current.

9. An Arrangement according to claim 7, further including means for generating said successive representative signals in response to prescribed characteristics of said received signals.

10. An Arrangement according to claim 9, wherein said generating means comprises means for hard limiting said received signals.

11. An Arrangement according to claim 9, wherein said generating means comprises means for generating said successive representative signals based upon a prescribed relationship between the amplitude of said received signals and a prescribed comparison reference function.

12. For use in a digital data communication system wherein information signals are subjected to convolutional error correction coding and transmitted over a communication channel, a Viterbi algorithm decoder for recovering digital data signals that have been transmitted over said channel comprising:
a prescribed pattern of circuit elements, a prescribed electrical characteristic each of which is controllable, coupled between first and second reference potential nodes;
means, coupled to said prescribed pattern of circuit elements, for controlling the effect of said circuit elements on the electrical characteristics of said pattern in response to signals received over said communication channel; and
means, coupled to said prescribed pattern of circuit elements between said first and second nodes, for generating an output representative of a recovered digital data signal in accordance with the effective minimum distance path of current flow through said pattern between said first and second nodes.

13. An arrangement according to claim 12, wherein said prescribed pattern comprises a trellis of said circuit elements coupled between said first and second nodes.

14. An arrangement according to claim 13, wherein said generating means comprises means, coupled to selected branches of said trellis, for generating an output representative of a recovered digital data signal in accordance with which of said selected branches of said trellis draws the largest current.

15. An arrangement according to claim 10, wherein said controlling means includes means for storing signals representative of successive ones of said received signals and controlling prescribed ones of said circuit elements in accordance with prescribed ones of said stored signals, respectively.

16. An arrangement according to claim 15, further including means for generating said successive representative signals in response to prescribed characteristics of said received signals.

17. An arrangement according to claim 15, wherein said generating means comprises means for hard limiting said received signals.

18. An arrangement according to claim 16, wherein said generating means comprises means for generating said successive representative signals based upon a prescribed relationship between the amplitude of said received signals and a prescribed comparison reference function.

19. An arrangement according to claim 15, wherein said generating means comprises means, coupled to selected branches of said trellis, for generating an output representative of a recovered digital data signal in accordance with which of said selected branches of said trellis draws the largest current.

20. An arrangement according to claim 19, wherein each of said circuit elements comprises a nonlinear circuit device and a switch coupled therewith for controlling the effective electrical insertion of said device in a branch of said trellis in response to a control signal applied thereto.

21. An arrangement according to claim 12, wherein said prescribed pattern of circuit elements comprises a trellis of diode circuits coupled between said first and second nodes, each diode circuit in a trellis branch comprising at least one diode and a controllable switch coupled in parallel therewith.

22. An arrangement according to claim 21, wherein said switch is connected in parallel with said diode in a respective trellis branch and is selectively opened or closed by said controlling means.

23. An arrangement according to claim 22, wherein said generating means comprises means coupled to selected branches of said trellis, for generating an output representative of a recovered digital data signal in accordance with which of said selected branches of said trellis draws the largest current.

24. An arrangement according to claim 23, wherein said controlling means includes means for storing signals representative of successive ones of said received signals and controlling respective ones of said diode circuits in accordance with respective ones of said stored signals.

25. An arrangement according to claim 24, wherein each diode circuit comprises first and second diode circuits coupled in series in a respective branch of said trellis, each of first and second diode circuits containing at least one diode and a switch coupled in parallel therewith, said switch being selectively opened or closed by said controlling means.

26. An arrangement according to claim 25, wherein said first and second diode circuits contain diodes having effectively different voltage drops thereacross.

27. An arrangement according to claim 25, wherein said first and second diode circuits contain respectively different numbers of diodes therein.

28. For use in a digital data communication system wherein information signals are subjected to convolutional error coding and transmitted over a communication channel, a method of recovering digital data signals that have been transmitted over said channel comprising the steps of:
(a) providing a prescribed pattern of circuit elements, a preselected electrical characteristic of each of which is controllable, between first and second reference potential nodes;
(b) controlling the effective electrical characteristics of said pattern of circuit elements in accordance with successive ones of signals received over said channel; and
(c) generating an output representative of a recovered digital data signal in accordance with the effective minimum distance path of current flow through said pattern of elements between said first and second nodes.

29. A method according to claim 28, wherein step (a) comprises providing a trellis of diode circuits between said first and second nodes, each diode circuit on a trellis branch containing at least one diode and a controllable switch coupled in parallel therewith.

30. A method according to claim 28, wherein step (c) comprises generating an output representative of a recovered digital data signal in accordance with which one of plural selected branches of said trellis draws the largest current.

31. A method according to claim 30, wherein step (b) comprises generating signals representative of successive ones of said received signals and controlling prescribed ones of said circuit elements in accordance with prescribed ones of said generated signals, respectively.

32. A method according to claim 28, wherein each of said circuit elements comprises a nonlinear circuit device and a switch coupled therewith for controlling the effective electrical insertion of said device in a branch of said trellis in response to a control signal applied thereto.

33. A method according to claim 32, wherein said prescribed pattern of circuit elements comprises a trellis of diode circuits coupled between said first and second nodes, each diode circuit in a trellis branch comprising at least one diode and a controllable switch coupled in parallel therewith.

34. A method according to claim 31, wherein step (b) comprises storing said generated signals and controlling said prescribed ones of said circuit elements in accordance with said prescribed ones of said stored generated signals.

35. A method according to claim 34, wherein step (b) comprises generating said successive signals based upon a prescribed relationship between the amplitude of said received signals and a prescribed reference function.

36. A method according to claim 35, wherein step (b) includes hard limiting said received signals.

* * * * *